(12) United States Patent
Avery et al.

(10) Patent No.: US 6,340,113 B1
(45) Date of Patent: Jan. 22, 2002

(54) SOLDERING METHODS AND COMPOSITIONS

(76) Inventors: Donald H. Avery, 6325 NE. Barrett Dr., Poulsbo, WA (US) 98370; John P. Ranieri, 2719 Wooldridge Dr., Austin, TX (US) 78703

( * ) Notice: Subject to any disclaimer, the term of this patent is extended or adjusted under 35 U.S.C. 154(b) by 0 days.

(21) Appl. No.: 09/226,942

(22) Filed: Jan. 8, 1999

Related U.S. Application Data (62) Division of application No. 08/726,194, filed on Oct. 4, 1996, now abandoned.
(60) Provisional application No. 60/004,998, filed on Oct. 10, 1995, provisional application No. 60/004,885, filed on Oct. 6, 1995, and provisional application No. 60/005,034, filed on Oct. 6, 1995.

(51) Int. Cl.[7] .............................................. B23K 31/00
(52) U.S. Cl. ............................... 228/248.5; 228/233.2; 228/248.1
(58) Field of Search ......................... 228/248.5, 248.1, 228/233.2, 234.1

(56) References Cited

U.S. PATENT DOCUMENTS

| | | | |
|---|---|---|---|
| 4,737,112 A | 4/1988 | Jin et al. ..................... | 428/900 |
| 4,740,252 A | 4/1988 | Hasegawa et al. ............ | 148/24 |
| 5,118,029 A | 6/1992 | Fuse et al. ................... | 228/198 |
| 5,156,321 A | 10/1992 | Liburdi et al. ............... | 228/119 |
| 5,248,475 A | 9/1993 | Feldstein ..................... | 419/38 |

(List continued on next page.)

FOREIGN PATENT DOCUMENTS

| | | |
|---|---|---|
| DE | 2601765 A1 | 7/1976 |
| DE | 3408289 A1 | 9/1985 |

(List continued on next page.)

OTHER PUBLICATIONS

Adams, P., Thermal Fatigue of Solder Joints in Micro–Electronic Devices, M.S. Thesis, Mech. Eng., M.I.T. 3–47 (1986).

(List continued on next page.)

*Primary Examiner*—Tom Dunn
*Assistant Examiner*—Kiley Stoner (57) ABSTRACT

Soldering methods and compositions are disclosed to provide electrical connections between surfaces with reduced likelihood of short circuits or solder-starved joints. Two component solder compositions are employed to preferably form "metallic foam" joints upon heating. In one embodiment, bimetallic particles are disclosed which fuse together rapidly reducing the likelihood of reflow-related solder joint faults. The methods and compositions of the present invention can also reduce the potential for thermal fatigue and other solder joint failures in electronic devices following fabrication because the porous solder joints relieve plastic constraints and lower the average tensile joint stress. In one preferred embodiment, solder compositions are employed which are composed of particles of a first metal coated with a second metal. Alternatively, the compositions can include particles of a first metal surrounded by a salt solution or suspension of a second metal. The metals are chosen such that their individual melting points are higher than the melting points of the alloy or alloys formed when they are combined. Upon heating of such coated particles, melting occurs at the interfaces between the core materials and their coatings. The liquid so formed causes various particles to fuse together in a porous metal foam that provides an electronic connection capable of withstanding thermal cycling with significantly lower failure rates. This soldering technique is particularly advantageous when applied to soldering of ball arrays and similar structures that facilitate mounting of chips to printed circuit boards, other chips or substrates, generally. The present invention can also be useful in reducing the total amount of lead and/or other toxic components present in solder compositions.

11 Claims, 3 Drawing Sheets

U.S. PATENT DOCUMENTS

| | | | |
|---|---|---|---|
| 5,269,453 A | * 12/1993 | Melton et al. | 228/180.22 |
| 5,296,649 A | 3/1994 | Kosuga et al. | 174/250 |
| 5,299,730 A | 4/1994 | Pasch et al. | 228/180.22 |
| 5,317,191 A | * 5/1994 | Abe | 257/746 |
| 5,328,522 A | 7/1994 | Sowa et al. | 148/23 |
| 5,385,290 A | 1/1995 | Degani | 228/180.22 |
| 5,427,865 A | 6/1995 | Mullen, III et al. | 428/599 |
| 5,429,293 A | 7/1995 | Bradley et al. | 228/180.22 |
| 5,540,379 A | * 7/1996 | Kazem-Goudarzi et al. | 228/248.5 |
| 5,573,602 A | * 11/1996 | Banerji et al. | 148/24 |
| 5,573,859 A | 11/1996 | Supplesa | 428/553 |
| 5,591,941 A | 1/1997 | Acocella et al. | 174/266 |
| 5,801,446 A | * 9/1998 | DiStefano et al. | 257/778 |
| 5,834,824 A | * 11/1998 | Shepherd et al. | 257/530 |
| 5,885,849 A | * 3/1999 | DiStefano et al. | 438/108 |
| 5,950,908 A | * 9/1999 | Fujino et al. | 228/248.1 |
| 6,056,831 A | * 5/2000 | Egitto et al. | 148/241 |
| 6,077,380 A | * 6/2000 | Hayes et al. | 156/283 |

FOREIGN PATENT DOCUMENTS

| | | |
|---|---|---|
| FR | 949279 | 8/1949 |
| JP | 61009992 | 1/1986 |
| JP | 402022892 A | * 1/1990 |
| JP | 5096396 | 4/1993 |
| JP | 11514300 W | * 12/1999 |
| WO | WO 93/07978 | 4/1993 |
| WO | WO-97/12718 | * 4/1997 |

OTHER PUBLICATIONS

Corbin, J.S., "Finite element analysis for Solder Ball Connect (SBC) structural design optimization", *IBM J. Res. Develop.* vol. 17, No. 5 (Sep. 1993) pp. 585–596.

Bikerman, J.J., "The Fundamentals of Tackiness and Adhesion," *J. Colloid Interface Sci.*, vol. 2, 163–175 (1947).

Frear, D. et al., "A Microstructural Study of the Thermal Fatigue Failures of 60Sn–40Pb Solder Joints," *J Elec Mat.*, vol. 17, No. 2, 171–180 (1988).

Hagge, J., "Predicting Fatigue Life of the Leadless Chip Carriers Using Mason–Coffin Equations," *Proc. 2nd IEPS*, 199–208 (1982).

Hikasa, K., "Advanced Solder Precoating and Bumping Technology Using Super Solder," International Conference on Electronic Assembly Material and Process Challenges, Atlanta, GA, 1099–1–1099–6 (May 29–31 1996).

Ranieri, J. and Metcalf, S., "X–ray Inspection of Solder Joints," *Circuits Manuf*, vol. 12, 62–66 (1989).

Ranier, J. P., "Mechanics and Fracture Mechanisms of Large Aspect Ratio Solder Joints Subject to Plastic Constraint" (1988).

* cited by examiner

SOLDERING METHODS AND COMPOSITIONS

This application is a divisional application of Ser. No. 08/726,194 filed on Oct. 4, 1996, now abandoned and claims benefit of Provisional Nos. 60/004,998 filed Oct. 10,1995, 60/004,885 filed Oct. 6, 1995 and 60/005,034 filed Oct. 6, 1995. The contents of all of the aforementioned application(s) are hereby incorporated by reference.

BACKGROUND OF THE INVENTION

The technical field of this invention is soldering and, in particular, soldering methods and compositions that resist conductive joint fracture and/or facilitate automated soldering of complex electronic components, such as chips to printed circuit boards, to other chips, or to other substrates. The invention further concerns solder compositions that exhibit compliance, i.e. the ability to give easily with strain, and thus resist conductive joint fracture.

Modem electronic devices are typically formed by soldering electronic components together. Such devices can include logic or memory chips on printed circuit boards, multichip modules or complex integrated circuits. In these devices, numerous electrical connections must be formed between a component and its mating substrate. The conventional approach, especially with simple electronic components such as resistors, capacitors, transistors and small chips, has been to pass leads from the component through holes in the substrate and then to fill the hole with solder to secure the connection. However, as the device structures become denser and chips become smaller and more complex, the use of leads has become more and more cumbersome.

A more recent approach to joining electronic components is "surface mounting" in which metal regions or tabs on the components are aligned and soldered to corresponding metallized pads on the substrate. In these devices, numerous connections must be formed between the component and conductive circuitry on the substrate (a circuit board). The conducting paths on a substrate may form a tight network or array of connecting points. Thus, accuracy and precision in placement of the conducting pads on the substrate is essential to proper function of the resulting device. In one common approach, often referred to as "ball grid array" assembly, the metallized regions of the component or the mating pad of the substrate are prebumped with solder balls prior to assembly. The assembly is then heated so that reflow of the solder occurs, forming a permanent physical and electrical connection at each soldered point in the array.

Unfortunately, the reflow of molten solder is not always reliable. The solder can spread further than desired, causing short-circuits between adjacent conductive lines. In addition, the solder can migrate from the desired location creating a solder-starved joint or one in which the electrical connection has failed entirely. As the density of interconnective lines becomes greater and greater, the problem of solder reliability becomes increasingly more difficult to solve.

Moreover, most modem electronic solder connections are thin, high aspect ratio, joints. (The aspect ratio is a measure of the area of a solder joint divided by its thickness.) It is increasingly common for electronic components to be joined to printed circuit boards and the like by thin surface-mounting solder joints having a thickness of less than about 150 micrometers (less than 0.006 inches). In this regime, the solder joint is plastically constrained and can develop triaxial (hydrostatic) stresses several times greater than the average tensile strength of the bulk solder material. In addition, stresses arise from the thermal cycling of electronic circuits as the device incorporating such electronics is turned on and off. The solder joint experiences the full shear resulting from changes in component dimensions with temperature. Thus, even when solder joints are initially satisfactory, the nature of the joint itself becomes a critical point for device failure over time.

In addition to the physical limitations of conventional solder compositions in effecting reliable electronic connections, more and more concern has been expressed in recent years over the use of lead as one of the principal components in conventional solders. The toxicity of lead and the human body's limited capacity to reverse lead poisoning, has fueled a public health movement to curtail any unnecessary use of lead. The nature of automated soldering processes is such that significant amounts of lead are released as vapors into the processing facility. These vapors necessitate protective measures for personnel and the scrubbing of air before it can be released to the ambient environment. Moreover, since every electronic device eventually fails and must be discarded, the use of heavily leaded solders places an additional burden on waste disposal programs.

There exists a need for better methods and compositions for joining electronic components which can reduce the likelihood of conductive joint failure during the initial soldering process, and/or inhibit subsequent joint fatigue and/or fracture. Methods and compositions that can improve the efficiency of assembling ball grid arrays and the like would provide a solution to a problem that has troubled the automated manufacturing of complex electronic devices for a long time. Likewise, soldering methods and compositions which reduce triaxial stresses and, hence, the potential for joint fatigue, solder fracture or other electronic failure of thin, high aspect, solder joints, generally, would satisfy a long felt need in the art.

Moreover, solder compositions which can reduce the amount of lead necessary to form a reliable electric connection, and/or reduce the release of lead during manufacturing or waste disposal, would also address a long unsolved problem.

SUMMARY OF THE INVENTION

Soldering methods and compositions are disclosed that provide electrical connections between surfaces with reduced likelihood of short circuits or solder-starved joints. In addition, solder compositions are disclosed that exhibit compliance, i.e. the ability to give easily with strain, and thus resist conductive joint fracture. These solder compositions preferably form "metallic foam" joints upon heating.

Because the solder compositions of the present invention can fuse together rapidly without necessarily becoming entirely liquid, the invention reduces the likelihood of reflow-related solder joint faults. They can also reduce the potential for thermal fatigue and other solder joint failures in electronic devices following fabrication because the porous solder joints relieve plastic constraints and lower the average tensile joint stress. The compositions further provide proper standoff distance, the distance between the component and the substrate, allowing greater contact of the joint with the component. In other words, the compositions, by producing joints with proper standoff, prevent slumping of the joints away from the component.

In one aspect of the invention, solder compositions are employed which are composed of particles of a first metal coated with a second metal. The metals are chosen such that their individual melting points are higher than the melting points of the alloy or alloys formed when they are combined. Upon heating of such coated particles, melting occurs at the interfaces between the core materials and their coatings. The liquid so formed causes various particles to fuse together in a porous metal foam that provides a compliant electronic connection capable of withstanding thermal cycling with significantly lower failure rates. This soldering technique is particularly advantageous when applied to soldering of grid arrays and similar structures that facilitate mounting of chips to printed circuit boards, other chips or substrates, generally. The present invention can also be useful in reducing the total amount of lead and/or other toxic components present in solder compositions.

More generally, the solder compositions of the invention are formed from two distinct metallic components. The components can be elemental metals or metal salts. The components can be coated one upon the other or they can be physically separated. For example, an alternative to the bimetallic particles described above can be formed by particles of first metal surrounded by salt solution or suspension of the second metal. Again, the metals are chosen such that their individual melting points are higher than the melting points of the alloy or alloys formed when they combine. Upon heating to soldering temperature, the second metal or metal salt precipitates to coat the first metal particles with the second metal. Melting occurs at the interfaces between the core material, the first metal particles, and their coatings. Thus, by controlling the relative concentrations of the first metal and of the second metal, a porous metal foam is achieved.

High aspect ratio (large diameter/thickness) solder joints which are plastically constrained develop large hydrostatic stresses (Friction Hill) greatly in excess of their yield strength. Because the local high triaxial stresses arising from the Friction Hill prevent homogeneous yielding and, in a strain controlled system, will localize plastic deformation within the regions near free surfaces, abrupt brittle fracture through an intermetallic or along an interface can occur. In such situations, the service life of the joint during fatigue loading such as thermal cycling will be greatly reduced. The prevention of triaxial stress build up within such a strain controlled environment which can occur in, for example, leadless chip carrier solder joints requires a distribution of internal free surfaces within the joint. The solder system disclosed herein is a thin porous metal film with a regular distribution of pores.

In one embodiment, the solder composition can be formed from the usual components, tin and lead or their salts. For example, small lead or tin particles can be coated with a thin film of the other component, and mixed with flux paste. Alternatively, small particles of one metal, a metallic salt of the other metal and a flux can be employed. In either case when the temperature is raised to just above the eutectic temperature, solid state diffusion occurs across the lead-tin interface until its composition reaches the melting point. The particles then are interconnected by a thin near eutectic temperature liquid film. Capillary action draws the incompletely melted particles together. However, the particles do not flow because they are interlocked by this capillary action. Additional metal from the solid particle dissolves into the liquid increasing its composition and, thus its melting point. Diffusion into the liquid continues and its melting point rises until it solidifies isothermally. This forms an interconnecting network of solder "mini-elements" with a dense pore structure. It should be noted that the surfaces of the particles first melt and then solidify at a constant temperature as their composition changes.

The invention can be practiced by forming spheres (or other shapes) of one metal and coating them with another metal. For example, lead spheres coated with a thin layer of tin, or tin spheres coated with a thin layer of lead can be employed. Pure tin melts at 232° C. and pure lead melts at 327° C., but the lowest eutectic point of tin-lead alloys is 183° C. Hence, when the temperature of coated particles is brought to about 183° C., the lead and tin dissolve into each other at the interface between the core and the coating, forming a liquid. This liquid wets and bonds the particles into a continuous but porous joint that resembles a metal foam.

More generally, solder compositions according to the invention can be formed from bimetallic particles having a first core metal component with a first melting point and a second coating metal component with a second melting point. This coating process can occur prior to use or during the soldering process. The first and second metals are chosen for their capability of forming an alloy having a third melting point that is lower than either the first or second melting points, such that upon heating a liquid is formed at the interface between said first and second components of the particles. The reflow of the molten liquid between adjacent particles fuses the particles together as the composition goes beyond the eutectic point and re-solidifies.

Various techniques, known in the art, can be used to formn the coated, bimetallic particles of the invention, including for example, plating techniques. Alternatively, other coating techniques, known in the art, such as electroplating, deposition/substitution in the presence of an organic acid, barrel plating, vapor deposition, chemical vapor deposition, sputtering and ion or electron beam-assisted deposition can be employed.

The particles can take various shapes, including spherical, solid polygonal, ring-like, hollow cylindrical, conical and arcuate (crescent, or "C-clip" or otherwise curved) shapes. The choice of particle shape will influence, to an extent, the porosity and compliance of the resulting joint. Generally speaking, spherical particles provide greater packing density and, hence, will yield more compact (less porous) joint structures. Other shapes can be employed when more porous joints are desired. Moreover, the use of "C-clips" or otherwise arcuate shaped particles can be advantageously used to produce a joint with a higher degree of compliance and greater resiliency in response to vibrations. The metallic foams of the present invention, as well as the non-spherical geometries of the particles in some embodiments, facilitate more compliant joints and, thereby, allow the soldering of larger electronic components.

The size or diameter of the particles can also vary. (The term "diameter" is used here in its common sense, e.g., the width of particle across its mean or largest dimension.) In some applications it can be desirable to have a range of particle sizes. For example, it can be desirable to have the particles vary in size such that the largest particles are larger by a factor of three vis-à-vis the smallest particles. In other applications, a narrower size distribution may be desired. In one preferred embodiment, the particles have an average diameter ranging from about 1.0 to about 5000 micrometers, more preferably ranging from about 5 to about 1000 micrometers, and most preferably ranging from about 10 to about 500 micrometers.

Low lead solder compositions can also be achieved with the bimetallic particles of the invention. Since solder reflow and fusion in the invention occur only in a thin interface between the core and coating, less lead is needed to form a joint. In one embodiment, lead-coated tin balls are disclosed which significantly reduce the overall lead content of the composition as compared with conventional (60%Sn - 40%Pb) solder compositions. In another application, lead core balls with relatively thicker tin coatings can be employed. Such tin-coated lead balls can be used to encapsulate the lead component of the solder in order to reduce vaporization of lead during soldering operations.

More generally, the coatings of the present invention can range from about 0.1 to about 1000 micrometers, more preferably ranging from about 1 to about 500 micrometers, and most preferably ranging from about 5 to about 100 micrometers. The solder composition can further comprises a plurality of particles which, upon fusion, yield a porous joint having an average pore size ranging from about 1 micrometer to about 1000 micrometers, preferably about 5 micrometers to about 500 micrometers.

The invention will next be described in connection with certain illustrated embodiments. However, it should be clear that various changes and modifications can be made by those skilled in the art without departing from the spirit or scope of the invention.

DETAILED DESCRIPTION

The fatigue of thin solder joints (less than 0.006 inches thick) in a strain controlled environment is a complex phenomenon. The possibility of failure in critical components places limitations on both design and manufacturing requirements. This is particularly evident in the electronics industry, where the failure of any one of a large number of interconnections, poses a significant reliability risk. It has been discovered that premature failure of high aspect ratio Sn60-Pb40 solder joints may be due to plastic constraint. Plastic constraint of such joints was shown to severely change their mechanical properties, increasing their average tensile strength by a factor of six and the peak tensile stress by a factor of ten. Large hydrostatic stresses have been found in several other constrained adhesive systems. This triaxial stress state is predicted by the Friction Hill model. Constrained solder joints subjected to strains associated with normal thermal cycles may develop high stress states that can cause either rapid joint failure or severe localized plastic deformation. Electronic elements and the solder joints that connect them are substantially made of different materials. Therefore, during thermal cycling, their respective dimensions change differentially with temperature. The differential change in dimensions necessitates flexible joints. The hydrostatic stress reduces to zero at internal free surfaces within the joint system. Thus a system with a dense distribution of internal free surfaces (pores) will not develop the large hydrostatic stress component calculated and observed in high aspect ratio solder joints of sound material.

A novel material process is disclosed to produce, among other things, a highly porous thin tin-lead solder joint. Specifically the system consists of repeating arrays of strongly bonded solder particles, essentially a metal foam. Due to the large number of internal free surfaces, the thin porous joints may deform without developing large hydrostatic stresses. This minimizes the possibility of brittle fracture through the inter metallic or bulk joint, and damage due to large localized plastic deformations. In one embodiment, the technique used to create these structures utilizes the low melting temperature of the lead-tin eutectic and the diffusivities of lead and tin.

Figure 1:
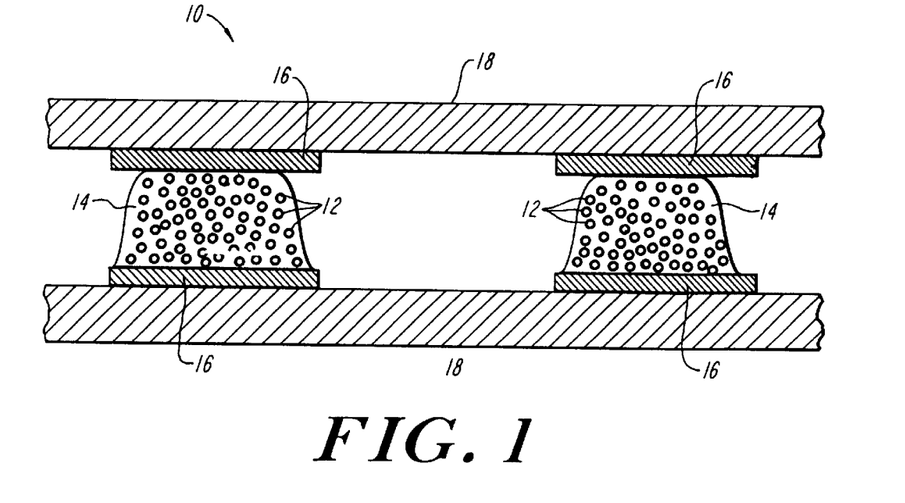
FIG. 1 is a schematic cross-sectional view of a bimetallic particle-based solder composition according to the invention deployed in a solder paste between two conductive elements.

In FIG. 1, a cross-sectional view of a bimetallic particle-based solder composition 10 is shown disposed between two device components 18 having conductive surfaces 16. The conductive surfaces 16 of each component 18 are placed in close proximity to each other, but in a spaced-apart relationship. Between each pair of conductive surfaces, a solder composition 10 according to the invention is disposed. The solder composition 10 includes the bimetallic particles 12 and, optionally, a flux 14 which binds the solder composition together.

Figure 2A:
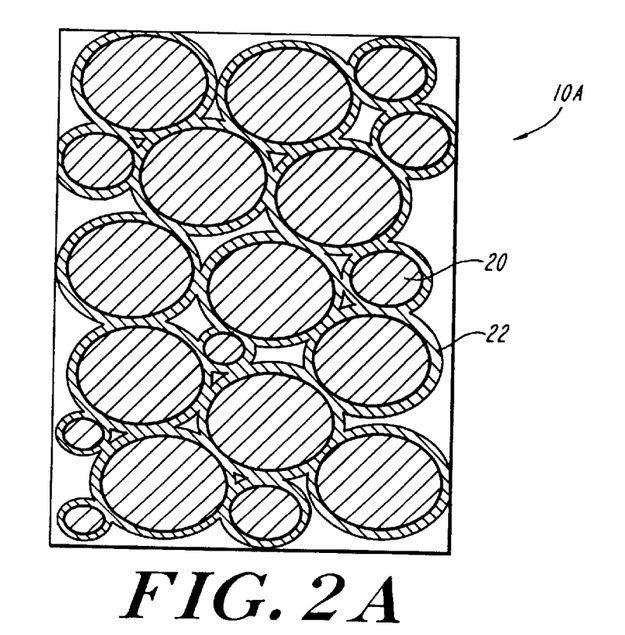
FIG. 2A is a schematic illustration of a solder composition according to the invention prior to heating.
Figure 2B:
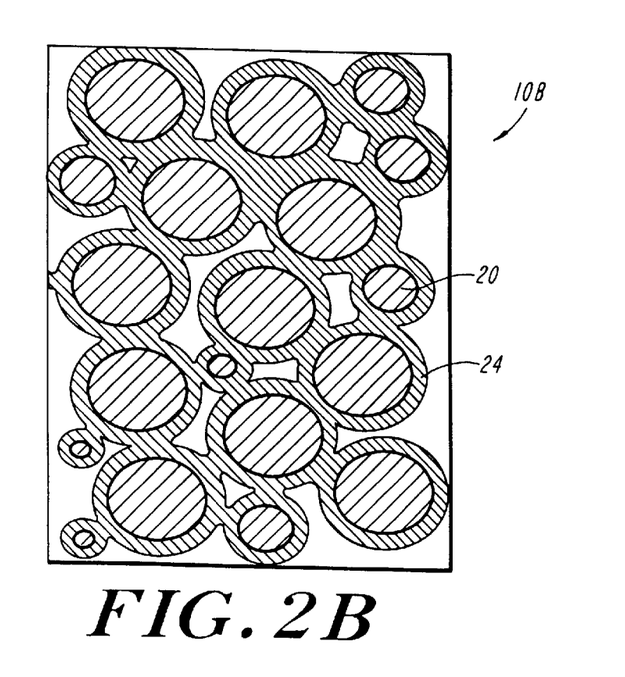
FIG. 2B is a schematic illustration of a solder composition according to the invention after heating.

FIGS. 2A and 2B, provide a schematic illustration of the solder composition of the present invention in use before and after, respectively, the application of heat. In FIG. 2A, a solder composition 10A is shown including bimetallic particles having an inner core metal 20 and an outer coating metal 22. The inner and outer metal components of the bimetallic particles are chosen such that they each have an individual melting point which is higher than the melting point of the two metals in an alloyed state.

As shown in FIG. 2B, when the temperature of the coated particles is brought to the eutectic point of their alloy, the metals dissolve into each other at the interface between the core and coating, forming a liquid 24. This liquid 24 flows and merges into a continuous but porous joint that resembles a metal foam, as shown schematically in FIG. 2B.

Various metals can be used in the present invention including, but not limited to two or more metals chosen from group consisting of aluminum, antimony, arsenic, bismuth, boron, cadmium, cobalt, copper, indium, iron, gallium, gold, lead, molybdenum, nickel, silicon, silver, tin, zinc and alloys thereof. As used herein the term "metal" is used in its general sense to encompass pure elemental metals as well as their alloys and metallic compounds. The term "bimetallic" is also used generally to refer to two or more metal components and should not be interpreted to exclude the use of three or more metals in the practice of this invention either as additional coatings, alloyed metals, fillers or otherwise.

In some instances it is desirable to incorporate the solder compositions of the present invention into solder pastes. Such solder pastes can be prepared by combining the composite particles described above with a flux. The specific flux ingredients used in the solder pastes of the present invention are not critical. In fact, any flux ingredients known to those skilled in the art can be employed in the solder pastes of the present invention. Typically, however, the flux will comprise at least one of the following ingredients: a rosin such as gum rosin, wood rosin, or tall oil rosin; derivatives of rosins such as dimerized resin, saponified resin or rosin derived ester resin (also known as "ester gum"); an activator such as an acid, e.g., an aliphatic acid, mineral acid or aromatic acid; or an amine, e.g., an aliphatic amine, or a halide salt of an amine; and a solvent such as an alcohol, glycol, ester, ketone, aromatic solvent, and the like. The solder paste of the present invention may also contain other ingredients such as, for example, Theological control agents such as castor oil and suspending agents, i.e., thickening agents, such as cellulose derivatives and ethoxylated amines. The selection of specific flux ingredients, including those ingredients known to those skilled in the art which are specifically described herein, and their proportions, is known to those skilled in the art. Likewise, the techniques for combining solder particles with flux to form solder paste are known by those skilled in the art.

A typical rosin based flux may contain, for example, about 5 to 20 weight percent of a solvent such as a glycol ether, about 1 to 15 weight percent of a rheological control agent such as castor oil with the balance comprising a rosin such as ester resin. (Percentages based on the total weight of flux without solder powder.) In addition, rosin based fluxed often contain an activator such as described above, e.g., adipic acid, in a concentration of about 1 to 15 weight percent based on the total weight of the flux. Some rosin based fluxes contain an effective amount of rosin, e.g., less than about 50 weight percent, to provide less than about 10 weight percent of solid residue remaining on the components being soldered after reflow of the solder paste (based on the weight of flux prior to reflow). Fluxes which provide low solid residue such as described above are known in the art as "no-clean" solder fluxes.

A typical water soluble flux may contain, for example, greater than 0.1 to 40 weight percent of a water soluble resin such as a saponified resin, from about 5 to 25 weight percent of a thickener, e.g., ethyl cellulose, about 1 to 20 weight percent of a solvent, e.g., poly(ethylene oxide) and poly (ethylene glycol) solvents, and about 1 to 15 weight percent of an activator, e.g., adipic acid and one or more alkanolamines. (Percentages based on the total weight of flux without solder particles.)

The bimetallic particles are preferably combined with the flux in order to evenly disperse the solder particles in the flux, e.g., by mixing. Typically, the solder powder will be combined with the flux to form a paste comprising from about 5 to 20 weight percent flux, preferably from about 8 to 15 weight percent flux, and often about 10 weight percent flux with the balance being coated solder powder. Preferably, the solder paste will contain from about 80 to 95 weight percent and more preferably, from about 85 to 92 weight percent of the coated solder powder based on the total weight of the solder paste. The concentration of solder in the solder paste can affect various properties of solder paste, such as, for example, viscosity, ease of deposition, slumping, tack retention and shelf life. The concentration of solder particles in the paste also affects the thickness of the solder remaining after the paste is reflowed. High concentrations of solder particles are desirable to provide a solder thickness which is sufficient to provide the required degree of electrical conductivity and mechanical strength as well as to provide adequate spacing between the component being soldered and the substrate surface to facilitate cleaning.

In other applications, it will be desirable to employ the composite solder particles of the present invention without any flux, e.g. as a dry free-flowing powder rather than a paste. For example, in automated operations for joining ball grid arrays a powder of composite particles can be applied to at least one of the surfaces such that the powder is deposited within the registration holes or wells.

Figure 3:
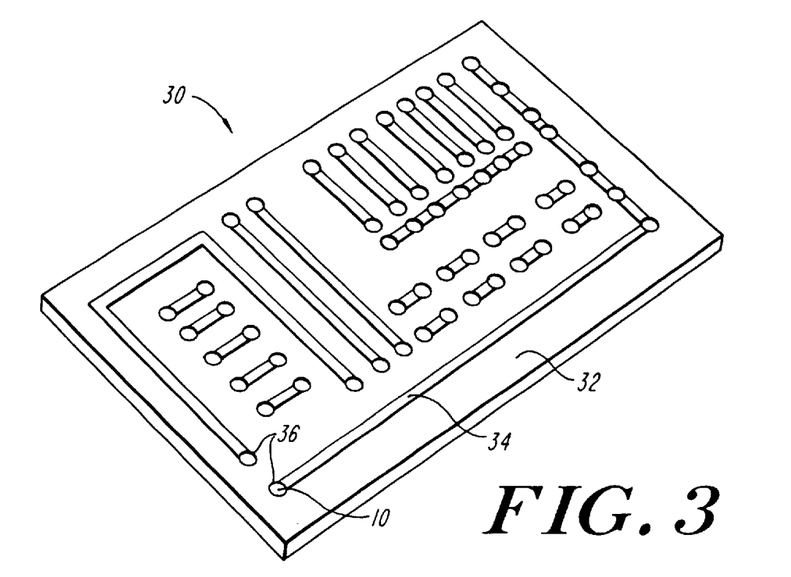
FIG. 3 is a schematic illustration of a substrate such as a printed circuit board or circuit grid array having wells for alignment with electronic component pins or contacts.

In FIG. 3, another aspect of the present invention is illustrated, that being, a pretreated circuit board or grid array 30. As illustrated, a substrate 32 (e.g., a printed circuit board or other circuit grid array) is shown having conductive lines 34 and a pattern of wells 36 which serve as receptacles for mating electrical component pins or contacts. The wells 36 of the substrate 32 can be filled prior to joining the substrate to an electrical component with the above-described solder composition 10. Various techniques known in the art can be used to dispose the solder composition 10 within the wells 36. For example, the solder composition can be injected into the wells, stamped into the wells or simply applied to the surface of the substrate 32 (with the excess solder composition being subsequently brushed away). In some applications, it may be desirable to partially bake the treated grid array 30 in order to secure the solder composition in the wells or otherwise to the substrate. (It should also be clear that the solder composition need not be deposited within wells. In an alternative embodiment, the solder composition (e.g., in a viscous paste form) can simply be prebumped upon selected regions of circuit array.)

Figure 4:
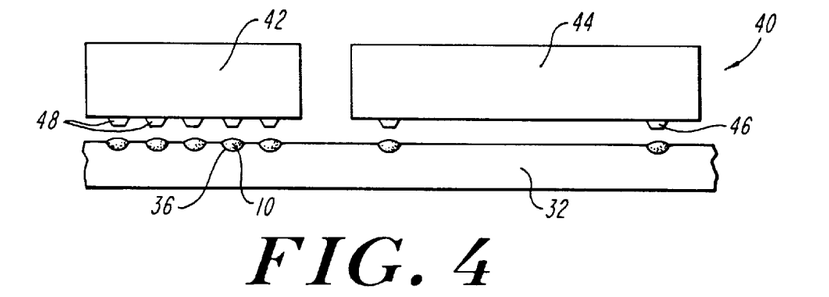
FIG. 4 is a schematic illustration of a substrate similar to shown in FIG. 3 with electronic components disposed above the substrate such that the component contacts are in alignment with the wells and the wells are filled with the solder composition of the present invention.

In FIG. 4, the joining of electronic components to a grid array to form a complete circuit 40 is illustrated schematically. As shown, the circuit 40 is formed when the illustrative components 42 and 44 are electrically connected to the conductive lines of substrate 32. As shown, electrical component 42 has a series of projecting pins or metallized pads 48 on its lower surface and electrical component 44 has a similar set of metallized contacts 46. These pins or contacts 48, 46 are configured to meet with corresponding wells or pads 36 in substrate 32. Again, as discussed above, the wells 36 are prefilled with the solder composition 10 of the present invention.

Figure 5:
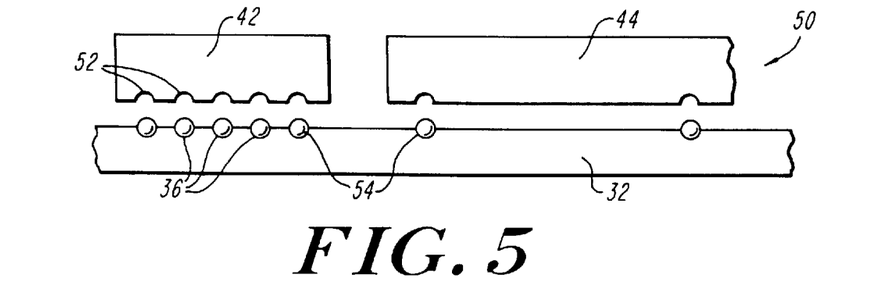
FIG. 5 is a schematic illustration of another substrate and corresponding electronic components in which both surfaces to be joined have metallized dimple contacts and a single, larger bimetallic particle is disposed within each of the lower set of dimples.

It should be appreciated that the structure as illustrated in FIGS. 3 and 4 are merely illustrative of the various grid array assembly techniques known in the art. Although wells and corresponding pins are illustrated as the registration mechanism in this instance, various other registration techniques can be used. In addition, the solder compositions of the present invention are not limited to "pin-in-well" joints, but rather can find use in any one of the various assembly configurations, including direct pad-to-pad configurations and the like. For example, FIG. 5 illustrates an alternative ball-grid array assembly 50 in which illustrative components 42 and 44 are to be electrically connected to the conductive lines of substrate 32. As shown, electrical components 42 and 44 have a set of metallized "dimple" contacts 52. These dimples 52 are configured to mate with corresponding solder-filled dimples 36 in substrate 32. Again, as discussed above, the wells 36 are prefilled with the solder composition 10 of the present invention. However, as illustrated in FIG. 5, the solder composition now comprises a single large metallic ball 54 which is secured within each of the substrate dimples 36. Upon joining and heating of the assembly, the metal contacts of the substrate 32 and components 42, 44 are joined by the partial melting and fusion of the bimetallic solder ball 54. Because the solder compositions of the present invention normally do not melt entirely, there is little likelihood of solder migration or short-circuits. Once the composition attains the melting point, the particles are interconnected by a thin near eutectic temperature liquid film. Capillary action draws the particles together. The solid particles do not flow because they are interlocked by this capillary action. Additional metal from the solid particle dissolves into the liquid increasing its composition and, thus its melting point. Diffusion into the liquid continues until it solidifies isothermally.

Solder joint failures in electrical packaging technologies are a major quality assurance concern within the microelectronics industry. The prominence of surface mount technologies and the goal of increased packaging densities demand greater solder joint reliability. Thermal fatigue, in particular, remains an intractable problem with a very low tail end of failed joints in spite of the general high reliability of the vast majority of interconnections. This results in added design and manufacturing quality constraints. Compounding this long term reliability issue are catastrophic random joint failures that occur after only a few thermal cycle qualification tests. Although much reliability analysis has been completed for surface mount technologies, the results are often not statistically significant to predict the tail end failures nor to provide the necessary design criteria for their prevention.

The failure of solder joints during thermal cycle loading has been attributed to variations in solder composition, manufacturing processing parameters, bulk solder properties, joint shape and intermetallic formation. Although these factors are important in producing reliable and reproducible interconnections, the mechanical properties of the solder joints as a plastically constrained thin film plays a major role in causing the atypical solder joint failure. This invention discloses solder joints with the improved mechanical properties of greater compliance and proper standoff distance (the distance between the electronic elements). The proper standoff distance is achieved by preventing flow of the solder composition. Flow is inhibited by capillary action described above and the largely unmelted particles. Joints that have the proper standoff distance make more consistent contact with the component. In other words, such joints do not slump away from the component.

A constrained thin film can develop a hydrostatic stress component orders of magnitude greater than its bulk properties. For many joint systems, it is well documented that high aspect ratio adhesive joints have tensile strengths far in excess of their yield strength. This phenomenon, referred to as a "Friction Hill", is due to the buildup of a triaxial stress state in the thin joint when the joint is subjected to a perpendicular strain at the substrate/interface. The extent to which it develops is dependent upon the specimen geometry, particularly the aspect ratio. A constrained joint subjected to relatively small external stresses may give rise to a large internal hydrostatic stress component that grows exponentially in relation to the applied external load.

Joints spanning the range of tin-lead compositions were fabricated following basic procedures outlined in the following examples. Namely, particles of the high concentration material which were the desired size and shape were coated with the other metal. These particles were put in contact and heated to a temperature slightly higher than the eutectic. The overall composition geometry of the joint depended on the size of the particles, the thickness of the lead or tin coating, and the reflow temperature.

EXAMPLE I

Tin-coated lead particles of diameter 0.01 to 0.02 inches were prepared by coating lead in a standard commercial electroless tin plating solution (Shipley LT-34 solution from Shipley, Inc. of Newton, Mass.), rinsed in DI water, dehydrated in alcohol, covered with a liquid flux, and heated to 220° C. in a vapor phase reflow unit. In the as received Shipley solution, the tin coating rate was too fast for the thickness to be controlled to the required tolerance. As expected, the coating rate was controlled by solution strength, reaction temperature and particle size. Because the Shipley solution was urea based, it could be diluted by ethyl alcohol. Acceptable coating rates occurred with 1:2 mixture (Shipley: ethyl alcohol) at 60° C., and specific thickness were obtained by controlling the length of the reaction. The particles had to be vigorously agitated while in the plating solution in order that each particle was uniformly coated and that they did not bond together in clusters.

EXAMPLE II

Lead-coated tin particles were prepared by depositing lead of controlled thickness onto tin particles in a solution of 1:3 ratio of fifty percent Lead perchlorate $(Pb(ClO_4)_2 \cdot 3H_2O)$ to water at 50° C. and vigorously agitated as before. The surface of the tin particles acted as a heterogeneous nucleation site, lowering the temperature at which lead can nucleate. Lead, therefore, preferentially deposited on the particle surface at lower temperatures and dilutions. Tin rich joining material of a size suitable for joining 25 ml leadless chip carriers to a standard electronic module (SEM) were fabricated using this method. Tin particles (available from Alpha Industries of Patterson, N.J.) were separated by sieve to diameters ranging between approximately 0.001 and 0.002 inches. Native oxide was removed by washing in concentrated nitric acid, rinsing in Dl water, and dehydrating in ethyl alcohol. The powder was then coated in the lead perchlorate solution for approximately 30 seconds, rinsed in Dl water and dehydrated with alcohol.

EXAMPLE III

A section of a joint which was fabricated from the lead coated tin powder of Example II by placing a layer of the bimetallic powder on a copper coupon, covering it with flux, and reflowing at 220° C. using a vapor phase reflow unit. Uniform voids were dispersed throughout the resulting joint which was strongly bonded to the copper coupon.

EXAMPLE IV

Powders prepared as described in Examples I and II were also combined with a flux base paste (Alpha RMA, rosin mildly activated) to yield a solder paste of a viscosity suitable for screen printing onto a standard electronic module. Using this paste, 25 mil leadless chip carriers (LCCs) were joined to a multilayer interconnect board (MIB) standard electronic module (SEM) and preliminary thermal cycle testing was conducted. These joints demonstrated fatigue lives at least as long as standard 60/40 Pb/Sn joints. More importantly, however, no joint failed catastrophically after thermal cycling as is sometimes observed with the continuous joints.

The paste was also used to bond together two zirconium copper coupons one inch in diameter. The soldered coupons were loaded in tension until failure at a rate of 20,000 lbs/minute following the procedure used to test joints fabricated from standard 60/40 Pb/Sn solder. The tensile strength of a joint of the porous solder used to join two one inch diameter copper coupons was typically only one third to one half the tensile strength of bulk eutectic solder, 2000 to 3000 psi versus 6000 psi. Failure occurred within the porous joint itself, while the joint Interface remained bonded.

Certain general observations were derived from the above samples and other experiments. When the material was heated to a temperature above the eutectic, the Pb-Sn interface liquefied. Shortly thereafter, at the same temperature, the reflowed material solidified. This phenomenon was the crux of the method used to design porous joints. When a thin coating of say lead is coated on tin spheres, and raised to a constant temperature above the eutectic point, tin and lead diffuse across the Pb-Sn interface. When the composition which melts at the given temperature is reached, the interface melts. Diffusion continues with more of the material becoming liquid until all of the surface lead is incorporated in the melt. Depending on the relative thickness of the tin and the lead coating, one of three processes can occur. If the coating is sufficiently thin, lead and tin will continue to diffuse into the liquid until the lead is dissolved, the surface would then be either a lead or tin rich liquid and the tin particles will wet and bond. As the liquid surface film continued to dissolve tin, the tin composition of the melt and its freezing point will rise as described by the solidus. When the freezing point of the melt rises above the reaction temperature, the film will freeze leaving the solidified porous joint. If, however, the coating is too thick, both lead and tin will continue to diffuse into the melt until all of the original tin sphere has been incorporated leaving either a solid surface with a liquid core or a fully liquefied solder alloy. In the first case, the liquid core will continue to dissolve lead with the composition and melting point rising; however, the spheres typically will not bind and form a joint. In the second, upon cooling the liquid will freeze as a homogeneous joint having a composition and structure corresponding to the overall composition of the tin and lead.

Thus, the thickness of the coating material is important to the success of the final joint. When correctly controlled a porous joint is obtained in which the surface of the particles first melt and then solidify isothermally at the reflow temperature making the soldering process easily controllable. Careful choice of both reflow temperature and coating thickness can result in a joint of any desired composition and percent porosity.

The solder compositions of the present invention can maintain their compliance even when the joint aspect ratio is very high and it is constrained between two higher strength surfaces. Because the porous joint does not develop large triaxial stress components, its fatigue life is longer than a non-porous joint in a strain controlled environment. In contrast, in homogeneous thin solid joints, even small strains can result in a yield strength several times its bulk value. Tensile tests performed on joints composed of either homogeneous solder or the porous material and having the same aspect ratio (thickness) demonstrated these concepts. Mainly, the thin homogeneous solder joints developed measured stresses of seven times the bulk strength of solder and fractured in a brittle manner. The porous joints typically failed at 2000 to 3000 psi, one third to two thirds the UTS of bulk solder, after the onset of plastic strain. While the elastic limit and UTS of the porous joints are substantially lower, many joining applications requiring a long fatigue life are cycled at low stresses well below the fatigue limit. For example, the lead-tin porous joints described here can be useful as joints which experience strains encountered during thermal cycling, caused by thermal gradients and material thermal expansion coefficient mismatches, such as are encountered on SEM. The tensile strength is not an important factor in a single joint on a circuit board connecting a leadless chip carrier because an unconstrained joint is not subjected to very high stresses. In this case the lower elastic limit of the porous joint should not pose a threat to joint life. In fact porous joints used to connect 25 mil LCCs demonstrated fatigue lives comparable to solder joints when the SEM were subjected to standard thermal tests. Additionally as predicted no porous joints failed catastrophically.

While the examples are directed to the lead-tin system, these techniques can be used to develop porous joints or metal foams in which composition and pore size are chosen for any material system which exhibits a melting point minimum such as a eutectic.

Moreover, the techniques disclosed herein can be extended to a wide range of alternative solder compositions formed from two metallic components, of either elemental metal or metallic salt origin so long as the composition as formulated or during use results in melting at the interface between the two metallic components. The liquid so formed causes the various particles to fuse together into a "metallic foam". For example, tin particles and an organic lead salt (e.g. lead naphthenate, lead rosinate, lead octylate, lead oleate, lead sterate) can be mixed in a flux to provide a composition for porous solder joints.

The present invention is particularly useful in applications where thin solder joints are required but the build up of hydrostatic stresses associated with continuous solder joints can limit their service lives. Using this method porous joints of many dimensions can be made. For example joints having uniformly dispersed pore sizes of 0.001 to 0.003 inches and joints having pores on the order of 0.05 inches were prepared. Additionally the overall composition of these joints can be precisely controlled to virtually any desired percentage of lead or tin. The UTS of material having proper compositions and dimensions for solder joints on electronic circuit boards was only one third to one half that of bulk solder. This should not, however, pose a problem in applications where joints are cycled well below their fatigue limit. Indeed when 25 mil leadless chip carriers were connected to SEM the joint material, those joints faired as well as standard continuous solder joints during thermal cycling tests.

What is claimed is:

1. A method of forming a compliant, porous failure-resistant joint between two opposed surfaces comprising the steps of:

applying a solder composition to at least one of said opposed surfaces, said solder composition comprising a plurality of bimetallic particles having a first core metal and a second coating metal, wherein a combination of the first and second metals has a lower melting point than either of the first and second metals alone, raising said particles to a temperature just above the melting point of the combination of the first and second metals, such that the second coating metal dissolves into the first core metal, and controlling the maximum temperature above the melting point of said combination of first and second metals to thereby form a compliant, porous failure-resistant joint that has an average pore size of from about 1 micrometer to about 1000 micrometers and that resists flowing or slumping.

2. The method of claim 1, wherein the step of applying a composition of coated particles further comprises mixing said composition with a flux paste.

3. The method of claim 1, wherein the step of applying a composition of coated particles further comprises applying a composition of particles coated to a controlled thickness to produce a solder joint of a desired composition and porosity.

4. The method of claims 1, further comprising providing said first and second opposed surfaces.

5. The method of claim 1, wherein said first core metal has a diameter of from about 1 micrometer to about 5000 micrometers, and said second coating metal has a thickness of about 0.001 micrometers to about 1000 micrometers.

6. The method of claim 5, wherein said first core metal has a diameter of from about 5 micrometers to about 1000 micrometers, and said second coating metal has a thickness of about 0.01 micrometers to about 500 micrometers.

7. The method of claim 6, wherein said first core metal has a diameter of from about 10 micrometer to about 500 micrometers, and said second coating metal has a thickness of about 0.05 micrometers to about 100 micrometers.

8. A method for the soldering of electronic parts comprising applying a solder composition to at least one of said electronic parts, said solder composition comprising a plurality of bimetallic particles having a first core metal and a second coating metal, wherein a combination of the first and second metals has a lower melting point than either of the first and second metals alone, said particles to a temperature just above the melting point of the combination of the first and second metals, such that the second coating metal dissolves into the first core metal, and controlling the maximum temperature above the melting point of the combination of said first and second metals to thereby form a compliant porous joint that has an average pore size of from about 1 micrometer to about 1000 micrometers and that resists flowing or slumping.

9. The method of claims 8, further comprising providing said two electronic parts.

10. A method of joining metal surfaces comprising the steps of:

applying a solder composition of particles to at least one of said metal surfaces, said solder composition comprising a plurality of particles including a first metal and a second metal solution surrounding said plurality of particles of the first metal, the first and second metals having the property that a combination of the metals has a lower melting point than either of the metals alone, and raising the temperature of the composition to just above the melting point of the combination of metals, such that the composition forms a solution around said first metal particles, said second metal precipitates to form a coating on said first metal particle, and said second metal coating dissolves into the first metal, resulting in a porous solder joint that has an average pore size of from about 1 micrometer to about 1000 micrometers and that resists flowing or slumping.

11. The method of claim 10, further comprising two metal surfaces.

* * * * *